US008847663B2

(12) United States Patent
Nagai et al.

(10) Patent No.: US 8,847,663 B2
(45) Date of Patent: Sep. 30, 2014

(54) GATE DRIVE CIRCUIT

(71) Applicant: Panasonic Corporation, Osaka (JP)

(72) Inventors: Shuichi Nagai, Osaka (JP); Takeshi Fukuda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/007,663

(22) PCT Filed: Jan. 23, 2013

(86) PCT No.: PCT/JP2013/000302
§ 371 (c)(1),
(2), (4) Date: Sep. 26, 2013

(87) PCT Pub. No.: WO2013/114818
PCT Pub. Date: Aug. 8, 2013

(65) Prior Publication Data
US 2014/0009202 A1    Jan. 9, 2014

(30) Foreign Application Priority Data
Jan. 30, 2012    (JP) .................. 2012-017083

(51) Int. Cl.
H03K 17/04    (2006.01)
H03K 17/687    (2006.01)
H03K 17/041    (2006.01)
H02M 1/08    (2006.01)

(52) U.S. Cl.
CPC ............ *H03K 17/041* (2013.01); *H03K 17/687* (2013.01); *H03K 17/04* (2013.01); *H02M 1/08* (2013.01)
USPC ............ 327/374; 327/376; 327/377; 327/389

(58) Field of Classification Search
USPC .................................................. 327/365–508
See application file for complete search history.

(56) References Cited

U.S. PATENT DOCUMENTS 5,686,854 A * 11/1997 Smith ........................... 327/374
6,100,720 A    8/2000 Kumagai et al.
(Continued)

FOREIGN PATENT DOCUMENTS

JP    03-062612    3/1991
JP    06-006967    1/1994
(Continued)

OTHER PUBLICATIONS

International Search Report issued Feb. 19, 2013 in International (PCT) Application No. PCT/JP2013/000302.
Andre Kurs, et al. : "Wireless Power Transfer via Strongly Coupled Magnetic Resonances", Science Express, vol. 317, No. 5834, pp. 83-86 (2007).

*Primary Examiner* — Brandon S Cole
(74) *Attorney, Agent, or Firm* — Wenderoth, Lind & Ponack, L.L.P.

(57)    ABSTRACT

A gate drive circuit which drives a gate terminal of a semiconductor switching device includes: a first wireless signal transmitter which transmits an input first AC signal wirelessly; a second wireless signal transmitter which transmits an input second AC signal wirelessly; a first rectifier circuit which includes a first diode that rectifies an output signal from the first wireless signal transmitter; and a second rectifier circuit which includes a second diode that rectifies an output signal from the second wireless signal transmitter. A threshold voltage of the second diode is larger than a threshold voltage of the first diode.

11 Claims, 7 Drawing Sheets

(56) References Cited

U.S. PATENT DOCUMENTS

| | | | |
|---|---|---|---|
| 6,692,444 B2 * | 2/2004 | Gozani et al. | 600/554 |
| 6,836,161 B2 * | 12/2004 | Akiyama et al. | 327/108 |
| 7,482,904 B2 | 1/2009 | Lee et al. | |
| 7,692,444 B2 | 4/2010 | Chen et al. | |
| 8,063,671 B2 * | 11/2011 | Xiao | 327/109 |
| 2001/0044640 A1 * | 11/2001 | Akiyama et al. | 607/2 |
| 2007/0268106 A1 | 11/2007 | Lee et al. | |
| 2014/0009202 A1 * | 1/2014 | Nagai et al. | 327/374 |

FOREIGN PATENT DOCUMENTS

| | | |
|---|---|---|
| JP | 11-298315 | 10/1999 |
| JP | 2001-267905 | 9/2001 |
| JP | 2006-191747 | 7/2006 |
| JP | 2007-311753 | 11/2007 |
| JP | 2008-067012 | 3/2008 |
| JP | 2009-077104 | 4/2009 |

* cited by examiner

GATE DRIVE CIRCUIT

TECHNICAL FIELD

The present invention relates to a gate drive circuit which drives a gate terminal of a semiconductor switching device, and particularly to a gate drive circuit which has a function to isolate a signal by contactless signal transmission.

BACKGROUND ART

A gate drive circuit in a semiconductor switching device (or a circuit which drives a semiconductor switching device) is a circuit which drives a gate terminal of the switching device (hereinafter the semiconductor switching device is also simply referred to as "switching device"). Such a gate drive circuit controls ON/OFF of the semiconductor switching device by applying a gate voltage to a gate terminal of, for example, a high-pressure resistant switching device such as an insulated gate bipolar transistor (IGBT) called a power semiconductor. A general gate drive circuit includes an output unit made of a P-type transistor and an N-type transistor. The P-type transistor operates when the switching device is turned ON from OFF and the N-type transistor operates when the switching device is turned OFF from ON. Specifically, when the switching device is turned OFF from ON, the gate current of the switching device is extracted.

In the above-described gate drive circuit, a reference voltage of the semiconductor switching device, that is the reference voltage on the output side of the gate driving circuit, is very high. Therefore, it is required to isolate a direct-current component (a signal ground) between the input side (primary side) of the gate drive to which a control signal is input and the output side (secondary side) of the gate drive circuit which drives the switching device. Such an electronic circuit element capable of isolating the direct-current component between the primary side and the secondary side is called a DC isolation device (or wireless signal transmitter). This is an element necessary to drive the switching device. Furthermore, the above-described electronic circuit element having the DC isolation function is used for isolating the logic ground and the RF ground, and is also called a digital isolator (Patent Literature (PTL) 1). Particularly, to drive a power semiconductor switching device, an external isolated power supply is required which requires a very large gate drive circuit also called a gate drive system. Therefore, if it is allowed not only to isolate a gate signal but also to supply isolated power to the gate, the external isolated power supply is no longer required and the gate isolating circuit can be miniaturized.

As a signal transmission circuit having the DC isolation function, as shown in FIG. 7, a power (signal) transmission device using an open-ring electromagnetic resonance coupler as a wireless signal transmitter has been proposed (for example, see PTL 2).

CITATION LIST

Patent Literature

[PTL 1] Description of U.S. Pat. No. 7,692,444
[PTL 2] Japanese Unexamined Patent Application Publication No. 2008-067012

SUMMARY OF INVENTION

Technical Problem

However, the conventional signal transmission circuit having the DC isolation function simply transmits a signal (or power) wirelessly, and has a problem in that the semiconductor switching device cannot be operated at high speed.

In other words, when the semiconductor switching device is driven using the conventional signal transmission circuit including the wireless signal transmitter, the wireless signal transmitter can supply a gate current to the semiconductor switching device to turn ON the semiconductor switching device from OFF, but the semiconductor switching device cannot be fallen at high speed since the charges accumulated at the gate of the semiconductor switching device cannot be effectively (actively) extracted when the semiconductor switching device is turned OFF from ON. This is because the wireless signal transmitter such as an electromagnetic resonance coupler is an element which only transmits power passively, and therefore the wireless signal transmitter can supply power to the load but cannot actively extract the power.

The present invention has been conceived in view of the above problem in the conventional technique, and has an object to provide a gate drive circuit which has DC isolation function and is capable of providing a drive signal with not only short rise time but also short fall time to the semiconductor switching device,

Solution to Problem

In order to solve the above problem, a drive circuit according to an aspect of the present invention is a gate drive circuit which drives a gate terminal of a semiconductor switching device, the gate drive circuit including: a signal output port and a reference output port which constitute a terminal pair for outputting a signal for driving the gate terminal; a first wireless signal transmitter which receives a first high-frequency signal as an input, transmits the input first high-frequency signal wirelessly, and outputs the signal, the first high-frequency signal having been modulated and indicating a period during which the semiconductor switching device is ON; a second wireless signal transmitter which receives a second high-frequency signal as an input, transmits the input second high-frequency signal wirelessly, and outputs the signal, the second high-frequency signal having been modulated and indicating a period during which the semiconductor switching device is OFF; a first rectifier circuit which includes at least a first diode that rectifies the first high-frequency signal output from the first wireless signal transmitter to output to the signal output port a signal which has a voltage of a first polarity with respect to the reference output port; and a second rectifier circuit which includes at least a second diode that rectifies the second high-frequency signal output from the second wireless signal transmitter to output to the signal output port a signal which has a voltage of a second polarity with respect to the reference output port, the second polarity being opposite to the first polarity, wherein a threshold voltage of the second diode is larger than a threshold voltage of the first diode.

Advantageous Effects of Invention

With the gate drive circuit according to the present invention, a drive signal can be output which is isolated from an input signal and is with not only short rise time but also short fall time.

Moreover, with the gate drive circuit according to the present invention, an output signal can be output in which a voltage for turning ON the semiconductor switching device is higher than a voltage for turning OFF the semiconductor.

Therefore, an output signal can be output which has an appropriate ON voltage according to the characteristics of the semiconductor switching device to be driven.

DESCRIPTION OF EMBODIMENTS

Figure 1:
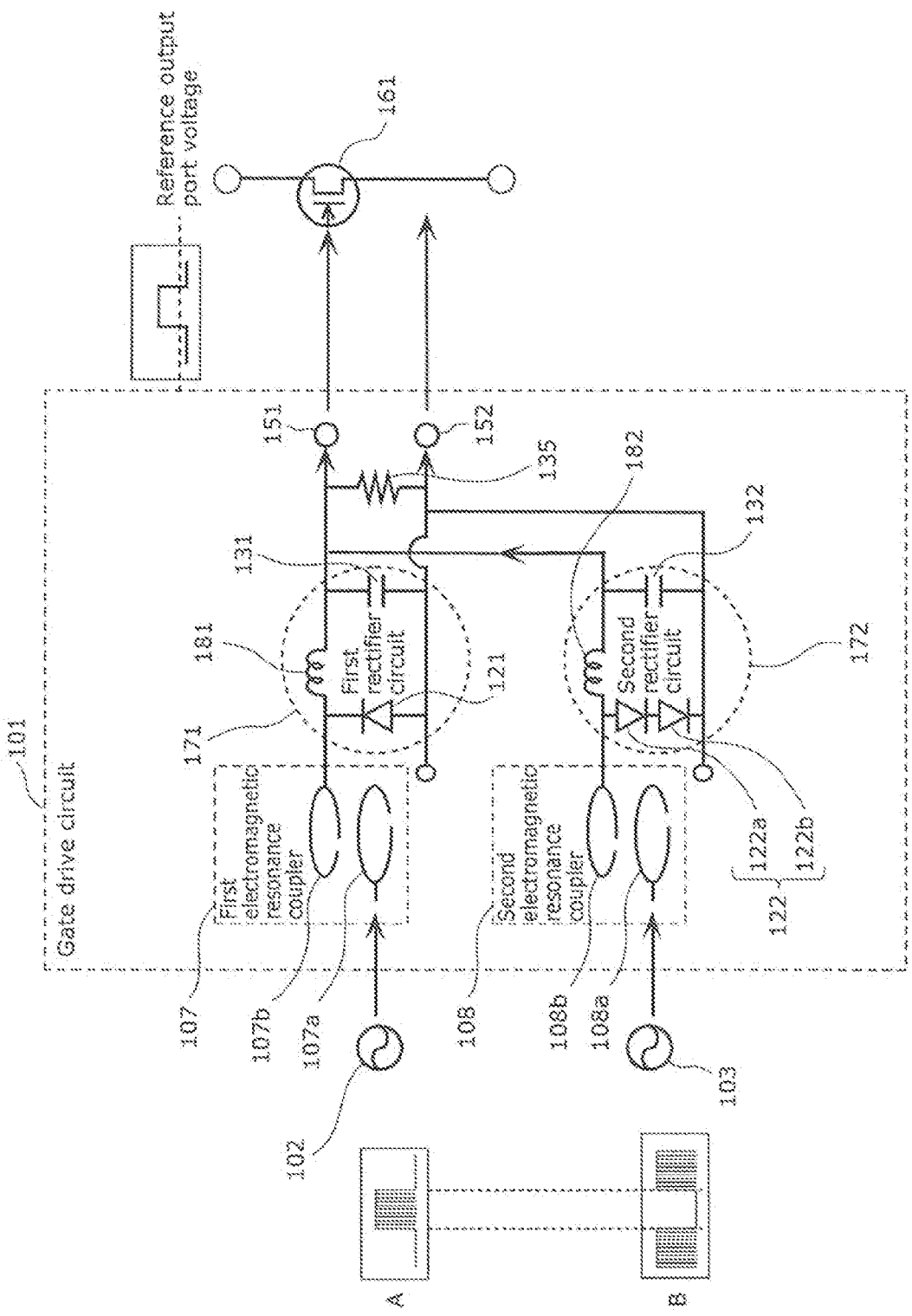
FIG. 1 is a block diagram showing a configuration of a gate drive circuit according to an embodiment of the present invention.

In order to solve the above problem, a drive circuit according to an aspect of the present invention is a gate drive circuit which drives a gate terminal of a semiconductor switching device, the gate drive circuit including: a signal output port and a reference output port which constitute a terminal pair for outputting a signal for driving the gate terminal; a first wireless signal transmitter which receives a first high-frequency signal as an input, transmits the input first high-frequency signal wirelessly, and outputs the signal, the first high-frequency signal having been modulated and indicating a period during which the semiconductor switching device is ON; a second wireless signal transmitter which receives a second high-frequency signal as an input, transmits the input second high-frequency signal wirelessly, and outputs the signal, the second high-frequency signal having been modulated and indicating a period during which the semiconductor switching device is OFF; a first rectifier circuit which includes at least a first diode that rectifies the first high-frequency signal output from the first wireless signal transmitter to output to the signal output port a signal which has a voltage of a first polarity with respect to the reference output port; and a second rectifier circuit which includes at least a second diode that rectifies the second high-frequency signal output from the second wireless signal transmitter to output to the signal output port a signal which has a voltage of a second polarity with respect to the reference output port, the second polarity being opposite to the first polarity, wherein a threshold voltage of the second diode is larger than a threshold voltage of the first diode.

This allows to provide not only a first path (first electromagnetic resonance coupler and first rectifier circuit) for outputting a signal for turning ON the semiconductor switching device, but also a second path (second electromagnetic resonance coupler and second rectifier circuit) for outputting a signal for turning OFF the semiconductor switching device. Thus, when the semiconductor switching device is turned OFF, the charges accumulated in the gate terminal of the semiconductor switching device are actively extracted, and the semiconductor switching device can be turned OFF at high speed. Furthermore, the first wireless signal transmitter and the second wireless signal transmitter isolate the input signal and the output signal.

Moreover, since the threshold voltage of the second diode included in the second rectifier circuit is larger than the threshold voltage of the first diode included in the first rectifier circuit, an output signal is output in which a voltage for turning ON the semiconductor switching device is higher than a voltage for turning OFF the semiconductor switching device. As a result, an output signal is output which has an appropriate ON voltage according to characteristics of the semiconductor switching device to be driven. Specifically, by setting the threshold voltage of the second diode of the second rectifier circuit for supplying a negative voltage large, when the first rectifier circuit is supplying a signal having a positive voltage, the signal can be prevented from flowing to the diode of the second rectifier circuit. Therefore, a positive voltage can be supplied efficiently. In addition, by controlling the threshold voltages of the diodes of these rectifier circuits, the output voltage (highest positive output voltage or lowest negative output voltage) from the gate drive circuit can be restricted.

Here, the first rectifier circuit further may include a first inductor, the second rectifier circuit may further include a second inductor, and the gate drive circuit may further include a capacitor connected between the signal output port and the reference output port. Thus, the inductors and the capacitor can (i) remove high-frequency components from an AC signal having a desired frequency and (ii) demodulate the modulated signal, which has been modulated to pass the first wireless signal transmitter and the second wireless signal transmitter, to the original input signal.

Here, the first inductor may be connected between the first wireless signal transmitter and the signal output port, and the second inductor may be connected between the second wireless signal transmitter and the signal output port. By locating the inductor at an appropriate position, the input high-frequency signal can be demodulated efficiently.

Furthermore, the second diode may include a plurality of diodes connected in series and each having a same threshold voltage as the threshold voltage of the first diode. The threshold voltage of the second diode can be made larger than the threshold voltage of the first diode by connecting multiple stages of diodes having the same characteristics. Thus, the diodes can be formed by the same fabrication process, which realizes the gate drive circuit as an integrated circuit.

Furthermore, the first diode may include one or more diodes connected in series, the second diode may include a plurality of diodes connected in series, and the number of the diodes included in the second diode may be greater than the number of the diodes included in the first diode. Using the desired number of diodes for the first rectifier circuit and the second rectifier circuit allows setting the highest positive voltage and the lowest negative voltage of the signal output from the gate drive circuit to a desired voltage.

Furthermore, the first diode may be composed of one diode, the second diode may be composed of one diode, and a threshold voltage of the diode composing the second diode may be larger than a threshold voltage of the diode composing the first diode. Thus, each of the first rectifier circuit and the second rectifier circuit is composed of one diode. Therefore, the ON resistance of the diode can be reduced and the high-frequency signal which has passed the wireless signal transmitter can be rectified efficiently.

Furthermore, an anode of each of the first diode and the second diode may comprise a different material. Using a different material for the first diode and the second diode allows controlling the threshold voltage of each diode. Therefore, a diode which is suitable for obtaining a desired output voltage can be designed.

Furthermore, each of the first wireless signal transmitter and the second wireless signal transmitter may be an electromagnetic resonance coupler including a transmission-side resonator and a reception-side resonator coupled by electromagnetic field resonance. Use of the electromagnetic resonance coupler as the wireless signal transmitter realizes lower transmission loss and larger output power. Specifically, an isolation gate drive circuit can be provided which is miniaturized and does not require an external isolated power supply (realizes lower power consumption). Accordingly, the gate drive circuit according to the present invention can not only isolate the input signal and the output signal but also supply the gate current for switching the semiconductor switching device directly without using an external power source.

Furthermore, the gate drive circuit may further include the semiconductor switching device, and may be a nitride semiconductor integrated circuit. By fabricating the gate drive circuit with the nitride semiconductor, the semiconductor switching device and the gate drive circuit which are made of nitride semiconductor can be integrated, thereby realizing a high-speed and miniaturized switching device.

A specific topology of the diodes in the rectifier circuit may be as follows: the anode of the first diode is connected to the reference output port, the cathode of the first diode is connected to the output terminal of the first wireless signal transmitter, the anode of the second diode is connected to the output terminal of the second wireless signal transmitter, and the cathode of the second diode is connected to the reference output port; or the anode of the first diode is connected to the output terminal of the first wireless signal transmitter, the cathode of the first diode is connected to the signal output port, the anode of the second diode is connected to the signal output port, and the cathode of the second diode is connected to the output terminal of the second wireless signal transmitter. Thus, a wide variety of gate drive circuit is realized which includes a rectifier circuit realized by various topology of the diodes.

Next, an embodiment and modification examples of the gate drive circuit according to the present invention are described with reference to the Drawings. It is to be noted that each of the embodiment and the modification examples described below is a preferable specific example of the present invention. The numerical values, shapes, materials, constituent elements, the arrangement and topology of the constituent elements, signal waveforms, and so on shown in the following embodiment and the modification examples are mere examples, and thus do not limit the present invention. The present invention is determined only by the statement in Claims. Thus, among the constituent elements in the following embodiment and modification examples, constituent elements not recited in any of the independent claims indicating the most generic concept of the present invention are not always required to achieve the aim of the present invention, and are described as preferable constituent elements.

FIG. 1 is a block diagram showing a configuration of a gate drive circuit 101 according to the embodiment of the present invention. This gate drive circuit 101 drives a gate terminal of a semiconductor switching device 161 (here, N-type transistor), and includes a signal output port 151 and a reference output port 152, a first electromagnetic resonance coupler 107, a second electromagnetic resonance coupler 108, a first rectifier circuit 171, a second rectifier circuit 172, and a pull-down resistor 135. It is to be noted that the pull-down resistor 135 is not a necessary constituent element for the gate drive circuit 101 according to the present invention, and is provided to obtain stable output signals.

The signal output port 151 and the reference output port 152 constitute a terminal pair for outputting a signal for driving the gate terminal of the semiconductor switching device 161. Here, the signal output port 151 is connected to the gate terminal, and the reference output port 152 is connected to the source terminal, of the semiconductor switching device 161.

The first electromagnetic resonance coupler 107 is a first wireless signal transmitter which accepts as an input a modulated first high-frequency signal (here, a first AC signal 102), transmits the input first AC signal 102 wirelessly, and outputs the signal. The first high-frequency signal indicates a period during which the semiconductor switching device 161 is ON.

The second electromagnetic resonance coupler 108 is a second wireless signal transmitter which accepts as an input a modulated second high-frequency signal (here, a second AC signal 103), transmits the input second AC signal 103 wirelessly, and outputs the signal. The second high-frequency signal indicates a period during which the semiconductor switching device 161 is OFF.

It is to be noted the first electromagnetic resonance coupler 107 and the second electromagnetic resonance coupler 108 are not limited to an electromagnetic resonance coupler, but may be a wireless signal transmitter such as a pulse transformer.

The first rectifier circuit 171 rectifies the first AC signal 102 output from the first electromagnetic resonance coupler 107 to output, to the signal output port 151, a signal having a voltage of a first polarity (here, positive) with respect to the reference output port 152. The first rectifier circuit 171 includes at least first diode 121 (here, the first diode 121, the first inductor 181, and the first capacitor 131). It is to be noted that the first inductor 181 and the first capacitor 131 are not necessary constituent elements for the gate drive circuit 101 according to the present invention and are provided for a more efficient rectification.

The second rectifier circuit 172 rectifies the second AC signal 103 output from the second electromagnetic resonance coupler 108 to output, to the signal output port 151, a signal having a voltage of a second polarity opposite to the first polarity (here, negative) with respect to the reference output port 152. The second rectifier circuit 172 includes at least a second diode 122 (here, the diode 122a and the diode 122b connected in series, the second inductor 182, and the second capacitor 132). It is to be noted that the second inductor 182 and the second capacitor 132 are not necessary constituent elements for the gate drive circuit 101 according to the present invention and are provided for a more efficient rectification.

With such a configuration, the gate drive circuit 101 according to the present embodiment is provided with not only a first path (first electromagnetic resonance coupler 107 and first rectifier circuit 171) for outputting a signal for turning ON the semiconductor switching device 161, but also a second path (second electromagnetic resonance coupler 108 and second rectifier circuit 172) for outputting a signal for turning OFF the semiconductor switching device 161. Thus, when the semiconductor switching device 161 is turned OFF, the charges accumulated in the gate terminal of the semiconductor switching device 161 are actively extracted, and the semiconductor switching device 161 can be turned OFF at high speed. Furthermore, the first wireless signal transmitter 107 and the second wireless signal transmitter 108 isolate the ground of the input signal and the output signal.

Furthermore, as a feature of this gate drive circuit 101, the threshold voltage of the second diode 122 is set to be larger than the threshold voltage of the first diode 121. In the present embodiment, the second diode 122 includes two diodes 112a and 112b each having the same characteristics as the first diode 121 (for example, a threshold voltage at which the current starts to flow is 1.4 V). Accordingly, the threshold voltage of the second diode 122 (here, 2.8 V) is larger than the threshold voltage of the first diode 121 (here, 1.4 V). This feature makes the output signal from the first rectifier circuit 171 less likely to flow to the second diode 122 as compared with the gate drive circuit including the first diode 121 and the second diode 122 having the same threshold voltage. Therefore, the first rectifier circuit 171 generates a higher positive output voltage (a signal which turns ON the semiconductor switching device 161 more certainly).

Further details are described on the configuration of the gate drive circuit 101.

This gate drive circuit 101 is an integrated circuit comprising a nitride semiconductor and outputs a signal for driving a gate terminal of the semiconductor switching device 161 comprising a nitride semiconductor (here, a power semiconductor switching device which is an N-type transistor comprising GaN). The reference output port 152 is connected to the source of the semiconductor switching device 161 and is floating (a state in which the input side and the output side are isolated at the border of the first electromagnetic resonance coupler 107 and the second electromagnetic resonance coupler 108) in the gate drive circuit 101, and is isolated from the ground (ground at the input side).

This gate drive circuit 101 is a signal transmission circuit which has DC isolation function for controlling ON/OFF of the semiconductor switching device 161. In the present embodiment, the gate drive circuit 101 includes the following: (1) an output terminal including a terminal pair constituted with the signal output port 151 and the reference output port 152, (2) a capacitor (first capacitor 131 and second capacitor 132) connected between the signal output port 151 and the reference output port 152, (3) a first electromagnetic resonance coupler 107 which includes a first transmission-side resonator 107a and a first reception-side resonator 107b which are coupled by electromagnetic field resonance, and is connected so that the modulated first AC signal 102 is input to the first transmission-side resonator 107a, (4) a second electromagnetic resonance coupler 108 which includes a second transmission-side resonator 108a and a second reception-side resonator 108b which are coupled by electromagnetic field resonance, and is connected so that the modulated second AC signal 103 is input to the second transmission-side resonator 108a, (5) a first rectifier circuit 171 which includes a first diode 121 connected to the first reception-side resonator 107b and demodulates the modulated first AC signal 102 to generate and output a first demodulated signal to the output terminal, (6) a second rectifier circuit 172 which includes a second diode 122 (two diodes 122a and 122b connected in series) connected to the second reception-side resonator 108b and demodulates the modulated second AC signal 103 to generate and output a second demodulated signal to the output terminal, (7) an inductor (first inductor 181 and second inductor 182) which is connected between the capacitor (first capacitor 131 and second capacitor 132) and the diode (first diode 121 and second diode 122), and (8) a pull down resistance 135 which is connected between the signal output port 151 and the reference output port 152.

FIG. 1 shows that, in the present embodiment, the first rectifier circuit 171 includes the first diode 121, the first inductor 181, and the first capacitor 131, and the second rectifier circuit 172 includes the second diode 122, the second inductor 182, and the second capacitor 132, in the same manner. However, each of the first capacitor 131 and the second capacitor 132 is connected between the signal output port 151 and the reference output port 152, and the first capacitor 131 and the second capacitor 132 may be implemented as a single capacitor. In this regard, it may be described that the first capacitor 131 and the second capacitor 132 are of the gate drive circuit 101, rather than of the first rectifier circuit 171 and the second rectifier circuit 172, respectively.

Here, the signal output port 151 is connected to the gate terminal of the semiconductor switching device 161, and the reference output port 152 is connected to the source terminal of the semiconductor switching device 161.

The cathode of the first diode 121 of the first rectifier circuit 171 is connected to the first reception-side resonator 107b of the first electromagnetic resonance coupler 107 (that is, the output terminal of the first electromagnetic resonance coupler 107). While, the anode of the first diode 121 of the first rectifier circuit 171 is connected to the reference output port 152.

The anode of the diode of the second rectifier circuit 172 is connected to the second reception-side resonator 108b of the second electromagnetic resonance coupler 108 (that is, the output terminal of the second electromagnetic resonance coupler 108). While, the cathode of the diode of the second rectifier circuit 172 is connected to the reference output port 152.

Here, the second diode 122 of the second rectifier circuit 172 includes the two diodes 122a and 122b connected in series and having the same characteristics (threshold voltage) as the first diode 121.

The first AC signal 102 is a signal indicating a period during which the semiconductor switching device 161 is ON, that is an input signal for supplying a signal power for causing the output terminal of the gate drive circuit 101 to generate a positive voltage (which is a high-frequency signal modulated into a frequency which can pass the first electromagnetic resonance coupler 107). Specifically, this first AC signal 102 is output as an output voltage in which a voltage at the signal output port 151 is positive with respect to a voltage at the reference output port 152. In contrast, the second AC signal 103 is a signal indicating a period during which the semiconductor switching device 161 is OFF, that is an input signal for supplying a signal power for causing the output terminal of the gate drive circuit 101 to generate a negative voltage (which is a high-frequency signal modulated into a frequency which can pass the second electromagnetic resonance coupler 108). Specifically, this second AC signal 103 is output as an output voltage in which a voltage at the signal output port 151 is negative with respect to a voltage at the reference output port 152.

The gate drive circuit 101 outputs, from the output terminal, an ON signal for turning ON the semiconductor switching device 161 and an OFF signal for turning OFF the semiconductor switching device 161. Here, the ON signal is a signal generated by demodulating the first AC signal 102, and is a signal in which the voltage at the signal output port 151 is higher than the voltage at the reference output port 152. Meanwhile, the OFF signal is a signal generated by demodulating the second AC signal 103, and is a signal in which the voltage at the signal output port 151 is lower than the voltage at the reference output port 152.

Although the modulated first AC signal 102 and the modulated second AC signal 103 are input to the gate drive circuit 101 in the present embodiment, the gate drive circuit 101 may include a circuit which generates the modulated first AC signal 102 and the modulated second AC signal 103. For example, the gate drive circuit 101 may include a circuit which generates the first AC signal 102 and the second AC signal 103 which have been modulated according to a control signal (or input signal) modulated by pulse width modulation (PWM) or the like, specifically, a circuit including an oscillator which generates a carrier wave and a modulator which generates the first AC signal 102 and the second AC signal 103 by modulating the carrier wave using the input signal. Furthermore, the gate drive circuit 101 may be implemented as a single-chip integrated circuit (for example, a nitride semiconductor integrated circuit) by itself, and together with the semiconductor switching device 161.

Here, the first AC signal 102 and the second AC signal 103 are high-frequency signals each obtained by modulating a carrier wave having a frequency ranging from a few MHz to a few GHz into a pulse waveform (PMW signal) having a frequency of approximately 100 KHz for example. Although description here is based on an assumption that the frequencies of the carrier waves of the first AC signal 102 and the second AC signal 103 are set to 5.8 GHz, the frequencies of the carrier waves of the first AC signal 102 and the second AC signal 103 may be different from each other. Using the carrier waves having different frequencies for the first AC signal 102 and the second AC signal 103 reduces the interference of the signals. Furthermore, based on the characteristics of the electromagnetic resonance coupler, a desirable frequency of the carrier wave for sufficient signal modulation is 10 MHz or greater. To be more specific, the frequency of the carrier wave of the first AC signal 102 is designed to suit a transmission frequency (operation frequency or resonant frequency) of the first electromagnetic resonance coupler 107, and the frequency of the carrier wave of the second AC signal 103 is designed to suit a transmission frequency of the second electromagnetic resonance coupler 108, in the same manner.

Figure 2:
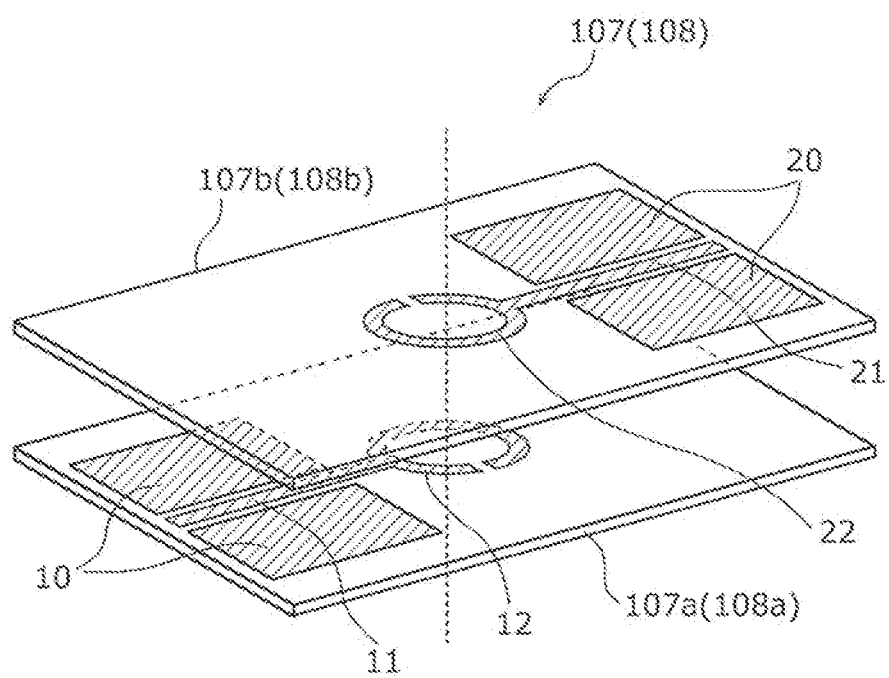
FIG. 2 is a schematic view of an electromagnetic resonance coupler which is an example of a wireless signal transmitter of the gate drive circuit according to the embodiment of the present invention.

In the present embodiment, the first electromagnetic resonance coupler 107 and the second electromagnetic resonance coupler 108 are each an open-ring electromagnetic resonance coupler as shown in FIG. 2, and are designed to be able to wirelessly transmit, a signal having a frequency of 5.8 GHz from the first transmission-side resonator 107a (second transmission-side resonator 108a) to the first reception-side resonator 107b (second reception-side resonator 108b) of the first electromagnetic resonance coupler 107 (second electromagnetic resonance coupler 108). The first transmission-side resonator 107a (second transmission-side resonator 108a) and the first reception-side resonator 107b (second reception-side resonator 108b) are conductive patterns including, on the substrates, open-ring circular portions 12 and 22 and the strait portions 11 and 21, respectively (the strait portions are each sandwiched between corresponding one of the ground patterns 10 and 20 divided in two sides and located some distance away from each other). Furthermore, the circular portions 12 and 22 are fixed at positions separated from each other by a certain distance to be facing each other and be symmetric by 180 degrees (details can be find in Andre Kurs, et al.: non-Patent Literature 1 "Wireless Power Transfer via Strongly Coupled Magnetic Resonances, Science Express, Vol. 317, No. 5834, pp 83-86 (2007)"). Using such an open-ring electromagnetic resonance coupler significantly miniaturizes the electromagnetic resonance coupler and allows integrating the electromagnetic resonance coupler into a semiconductor chip.

Although the first electromagnetic resonance coupler 107 and the second electromagnetic resonance coupler 108 are described as open-ring electromagnetic resonance couplers as shown in FIG. 2 in the present embodiment, the electromagnetic resonance coupler may be in a different shape (closed-ring, spiral, etc.).

The first reception-side resonator 107b is connected to the first rectifier circuit 171 including the first diode 121. The cathode of the first diode 121 is connected to the first reception-side resonator 107b, and the anode is connected to the reference output port 152 of the gate drive circuit 101. Moreover, the first inductor 181 is connected between the cathode and the signal output port 151.

In contrast, the second reception-side resonator 108b is connected to the second rectifier circuit 172 including the second diode 122 (diode 122a and diode 122b). The diode 122a and the diode 122b included in the second diode 122 are connected in series, and the cathode of the diode 122a and the anode of the diode 122b are connected. The anode of the diode 122a is connected to the second reception-side resonator 108b, and the second inductor 182 is connected between the anode and the signal output port 151. The cathode of the diode 122b and the signal output port 151 of the gate drive circuit 101 are connected. It is to be noted that the anode of the diode 122a corresponds to the anode of the second diode 122, and the cathode of the diode 122b corresponds to the cathode of the second diode 122.

Furthermore, the ground of the first reception-side resonator 107b (ground pattern 20 shown in FIG. 2) is connected to the reference output port 152, and the ground of the second reception-side resonator 108b (ground pattern 20 show in FIG. 2) is also connected to the reference output port 152.

Furthermore, the first capacitor 131, the second capacitor 132, and the pull-down resistor 135 are connected to be in parallel, between the signal output port 151 and the reference output port 152. Although the first capacitor 131 and the second capacitor 132 described above are separate capacitors independent from each other, a single capacitor in which those two capacitors are integrated into one may be used instead.

Although the first inductor 181 and the first capacitor 131 serve as a demodulator which removes the high-frequency signal rectified by the first diode 121, they are treated as constituent elements of the first rectifier circuit 171 in the present embodiment. Likewise, the second inductor 182 and the second capacitor 132 serve as a demodulator which removes the high-frequency signal rectified by the second diode 122, but they are treated as constituent elements of the second rectifier circuit 172 in the present embodiment.

The pull-down resistor 135 can stabilize impedance at the output side of the rectifier circuit (first rectifier circuit 171 and second rectifier circuit 172), even when various load (a changing load) is connected to the output terminal of the gate drive circuit 101. Thus, at the output terminal of the gate drive circuit 101, an excellent output signal can be obtained. However, since the gate drive circuit 101 can operate without the pull-down resistor 135, the pull-down resistor 135 is not a necessary constituent element for the gate drive circuit 101 according to the present invention.

Furthermore, a coupling capacitor, which realizes capacitive coupling which cuts a direct-current component of a signal, may be connected between the first electromagnetic resonance coupler 107 and the first rectifier circuit 171 and/or between the second electromagnetic resonance coupler 108 and the second rectifier circuit 172.

Next, an operation of the gate drive circuit 101 according to the present embodiment configured as above is described with reference to a signal waveform shown in FIG. 1.

FIG. 1 shows: a waveform of the modulated first AC signal 102; a waveform of the modulated second AC signal 103; and a waveform of an output signal of a voltage at the signal output port 151 with respect to the voltage at the reference output port 152. Each waveform is a voltage waveform with respect to the elapsed time. It is to be noted that the waveform of the output signal is a voltage waveform in which the signal output port 151 is plus with respect to the voltage at the reference output port 152. Furthermore, the first AC signal 102 indicating the ON period of the semiconductor switching device 161 and the second AC signal 103 indicating the OFF period of the semiconductor switching device 161 are collectively called an input signal to this gate drive circuit 101.

The first AC signal 102 and the second AC signal 103 are each a modulated signal obtained by modulating a carrier wave with a pulse waveform of a low frequency, and is a pulse waveform of a low frequency envelope (above-described PWM signal). Furthermore, the waveform of the envelope of the first AC signal 102 and the waveform of the envelope of the second AC signal 103 are inverted from each other. This first AC signal 102 is input to the first electromagnetic resonance coupler 107. Since the first AC signal 102 is a carrier wave having a frequency of 5.8 GHz, the signal is propagated from the input side to the output side via the first electromagnetic resonance coupler 107 wirelessly. Accordingly, the first AC signal 102 is transmitted from the first transmission-side resonator 107a to the first reception-side resonator 107b with high transmission efficiency due to the electromagnetic resonance coupling, and the first AC signal 102 is output from the first reception-side resonator 107b. As described above, in the present embodiment, the electromagnetic resonance coupler is used as the wireless signal transmitter and the transmission-side resonator and the reception-side resonator are strongly coupled, thereby significantly reducing the noise emitted to the outside and the effect by the noise. Therefore, an excellent output waveform can be obtained. It is to be noted that the ground at the input side (primary side), which is part of the circuit up to the first electromagnetic resonance coupler 107, is connected to the ground pattern 10 of the first transmission-side resonator 107a.

The first AC signal output from the first electromagnetic resonance coupler 107 is input to the first rectifier circuit 171, and the signal having a high frequency of 5.8 GHz is rectified (demodulated) by the first inductor 181 and the first capacitor 131 connected subsequently. In this step, the envelope detection is performed on the first AC signal 102, and therefore the high-frequency component is removed and the first AC signal 102 is demodulated into the pulse waveform. At this time, the cathode of the first diode 121 is connected to the signal output port 151 via the first inductor 181, and the anode of the first diode 121 is connected to the reference output port 152. Thus, a voltage is generated which becomes, at the signal output port 151, positive with respect to the voltage at the reference output port 152 (specifically, a voltage which turns ON the semiconductor switching device 161).

Since the output signal of the gate drive circuit 101 is the signal transmitted wirelessly via the first electromagnetic resonance coupler 107 which is a wireless signal transmitter, the output signal is isolated from the first AC signal 102, which makes the voltage at the reference output port 152 floating from the ground of the input side. Furthermore, a voltage corresponding to the first AC signal 102 can be supplied between the signal output port 151 and the reference output port 152.

However, if the gate drive circuit includes only a circuit which transmits the ON state of the input signal (the first path including the first electromagnetic resonance coupler 107 and the first rectifier circuit 171), a gate voltage can be supplied to the semiconductor switching device 161 connected to the output terminal of the gate drive circuit 101, but the supplied gate current (charges accumulated in the gate terminal) cannot be extracted when the input signal is turned OFF. Therefore, in the present embodiment, the second path including the second electromagnetic resonance coupler 108 and the second rectifier circuit 172 are provided to supply power having a voltage negative with respect to the reference output port 152 when the input signal is in the OFF state.

The second AC signal 103 is wirelessly transmitted to the second rectifier circuit 172 via the second electromagnetic resonance coupler 108. The second AC signal 103 output from the second electromagnetic resonance coupler 108 is input to the second rectifier circuit 172, and the signal having a high frequency of 5.8 GHz is rectified (demodulated) by the second inductor 182 and the second capacitor 132 connected subsequently. In this step, the envelope detection is performed on the second AC signal 103, and therefore the high-frequency component is removed and the second AC signal 103 is demodulated into the pulse waveform.

Here, unlike the first rectifier circuit 171, the cathode of the second diode 122 is connected to the reference output port 152 and the anode of the second diode 122 is connected to the signal output port 151. Thus, a voltage is generated which becomes, at the reference output port 152, positive with respect to the voltage at the signal output port 151. Specifically, as a signal which turns OFF the semiconductor switching device 161, a negative voltage is applied to the gate terminal of the semiconductor switching device 161 connected to the signal output port 151. Therefore, the charges accumulated in the gate of the semiconductor switching device 161 can be extracted when the input signal is turned ON from OFF, which realizes a switching operation in very short turn-off time.

Below is the reason why the first rectifier circuit 171 includes one diode (first diode 121) and the second rectifier circuit 172 includes two diodes (diode 122a and diode 122b), in the embodiment of the present invention. It is to be noted that, in the present embodiment, these three diodes (first diode 121 and diodes 122a and 122b) have the same characteristics (the same threshold voltage for the ON current).

Figure 3:
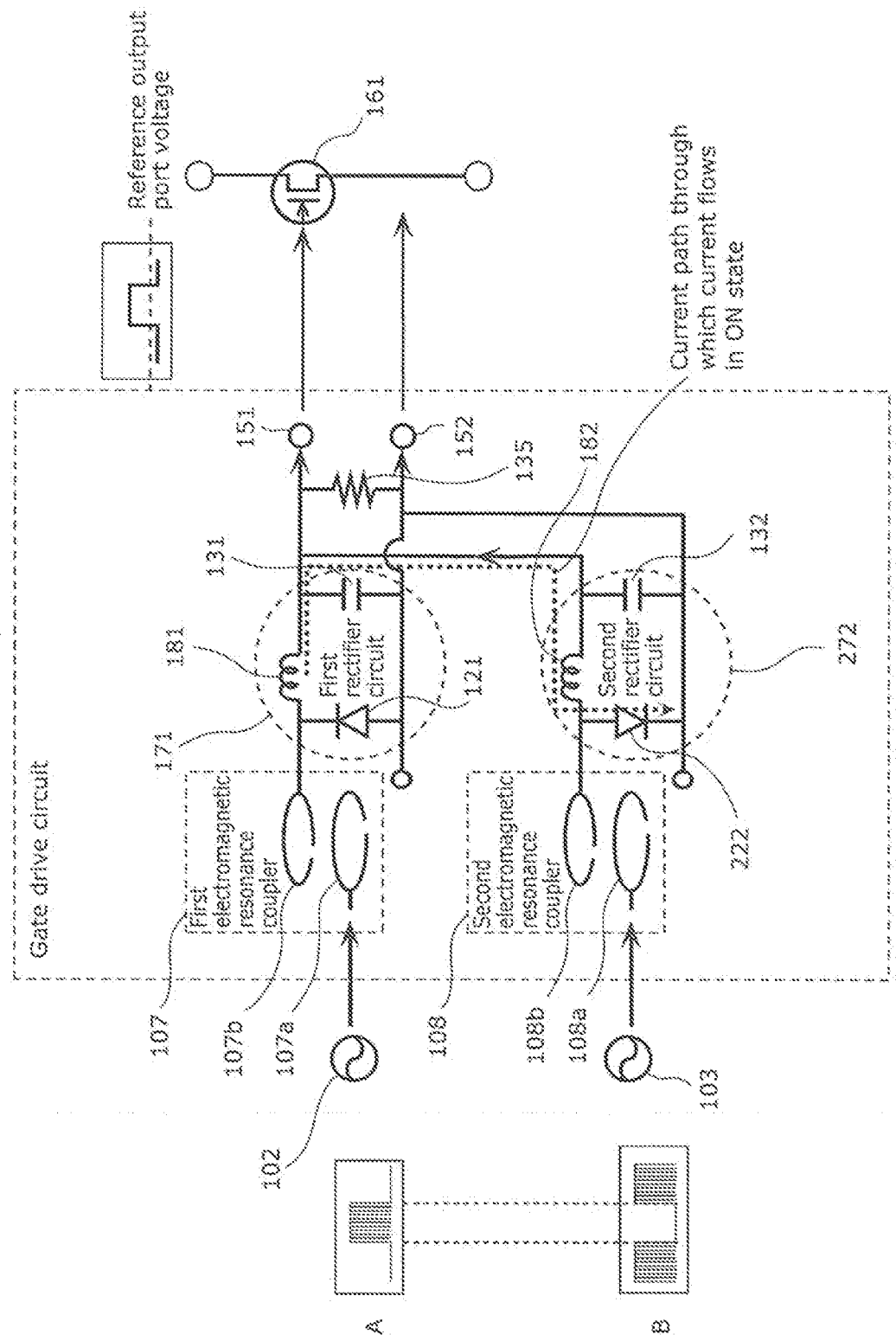
FIG. 3 is a block diagram showing a configuration of a gate drive circuit according to a reference example.

FIG. 3 illustrates a circuit diagram for the case where the rectifier circuits have the same configuration (one diode each) in a simple manner, which is the block diagram showing the configuration of the gate drive circuit in a reference example. The gate drive circuit according to this reference example is different from the gate drive circuit 101 according to the present embodiment in that a second diode 222 included in a second rectifier circuit 272 includes a single diode which has the same threshold voltage as the first diode 121 included in the first rectifier circuit 171.

Below is the description on the gate drive circuit shown in FIG. 3, when the first AC signal 102 is the signal indicating the ON state (ON period of the semiconductor switching device 161) and the second AC signal 103 is the signal indicating the OFF state (OFF period of the semiconductor switching device 161). The path through which the current flows in the above case is also shown in FIG. 3.

When the first AC signal 102 indicates the ON state, the first rectifier circuit 171 generates a voltage which becomes, at the signal output port 151, positive with respect to the reference output port 152. However, at this time, a voltage is generated in a forward direction between the cathode and the anode of the second diode 222 of the second rectifier circuit 272, and when this voltage becomes larger than or equal to the threshold voltage of the second diode 222, the current flows to the second diode 222. Therefore, the voltage larger than or equal to the threshold voltage of the second diode 222 cannot be output to the signal output port 151.

In contrast, in the present embodiment, the voltage at which the current starts to flow to the second diode 122 of the second rectifier circuit 172 can be increased by providing two diodes namely the diodes 122a and 122b connected in series as the second diode 122 in the second rectifier circuit 172 as shown in FIG. 1. Specifically, the highest positive output voltage output from the output terminal of the gate drive circuit 101 can be increased up to the sum of the threshold voltage of the diode 122a and the threshold voltage of the diode 122b. In other words, providing multiple stages (two or more stages) of diodes as the second diode 122 of the second rectifier circuit 172 allows increasing the highest voltage of the positive output voltage output from the gate drive circuit 101. The opposite is also true. Specifically, providing multiple stages (two or more stages) of diodes as the first diode 121 of the first rectifier circuit 171 allows lowering the lowest voltage of the negative output voltage output from the gate drive circuit 101 (allows making the voltage a negative voltage having a greater absolute value).

It is to be noted that when multiple stages of diodes are connected in the first rectifier circuit 171 or the second rectifier circuit 172, the combined resistance increases due to the internal resistance of the diodes which sometimes deteriorates the conversion efficiency of the first rectifier circuit 171 and the second rectifier circuit 172. Therefore, it is desirable to include the diode in the minimum number and suitable for the rectifier circuit.

Although each of the diodes included in the first rectifier circuit 171 and the second rectifier circuit 172 has the same characteristics (same threshold voltage) in the present embodiment, the present invention is not limited to the embodiment. To efficiently rectify the first AC signal 102 into a voltage in the first rectifier circuit 171, it is preferable that the first diode 121 has a small threshold voltage. Therefore, it is desirable to use the diode with a low threshold voltage as the first diode 121 while using the diode with a large threshold voltage as the second diode 122.

With the configuration according to the present embodiment, by controlling the threshold voltage of the first diode 121 of the first rectifier circuit 171 and the threshold voltage of the second diode 122 of the second rectifier circuit 172, the restriction for the output voltage can be set arbitrarily. Specifically, the threshold voltage of the first diode 121 defines the lowest negative voltage (maximum absolute value) for the output signal, and the threshold voltage of the second diode 122 defines the highest positive voltage for the output signal. Accordingly, the above scheme for controlling the threshold voltage of the diode of the rectifier circuit is effective when it is desired to change the maximum output voltage in the ON state and/or OFF state, such as when it is desired to prevent applying a high negative voltage to the gate of the semiconductor switching device 161 in the OFF state.

Figure 4:
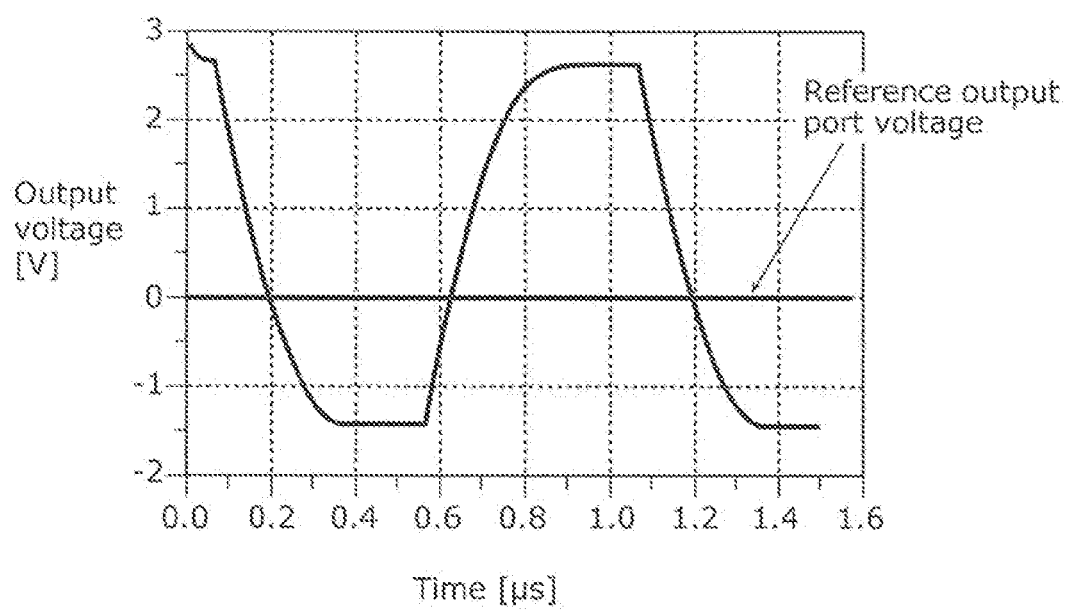
FIG. 4 shows a waveform of an output voltage of a gate drive circuit according to the embodiment of the present invention.

FIG. 4 shows an output voltage waveform of the gate drive circuit 101 according to the embodiment of the present invention. With the gate drive circuit 101 according to the present embodiment, as show in FIG. 4, a voltage is generated which becomes, at the signal output port 151, positive and negative with respect to the voltage at the reference output port 152. In the present embodiment, the highest positive voltage for the output signal is approximately 2.8 V that corresponds to the threshold voltage of the second diode 122, and the lowest negative voltage for the output signal is approximately −1.4 V that corresponds to the threshold voltage of the first diode 121.

As described above, the configuration using the multiple stages of diodes for the rectifier circuit is particularly effective when the gate drive circuit 101 and the semiconductor switching device 161 are integrated. It is because, when the gate drive circuit 101 and the semiconductor switching device 161 are integrated, they are fabricated in the same semiconductor fabricating process in general, and therefore the threshold voltage of the gate of the semiconductor switching device 161 and the threshold voltage of each diode of the rectifier circuit become equivalent. Therefore, if the second rectifier circuit 172 includes one diode, a voltage larger than the threshold voltage of the semiconductor switching device 161 cannot be supplied. Thus, it is effective to use multiple stages of diodes for the rectifier circuit to fabricate the gate drive circuit 101 with the integrated circuit.

Figure 5:
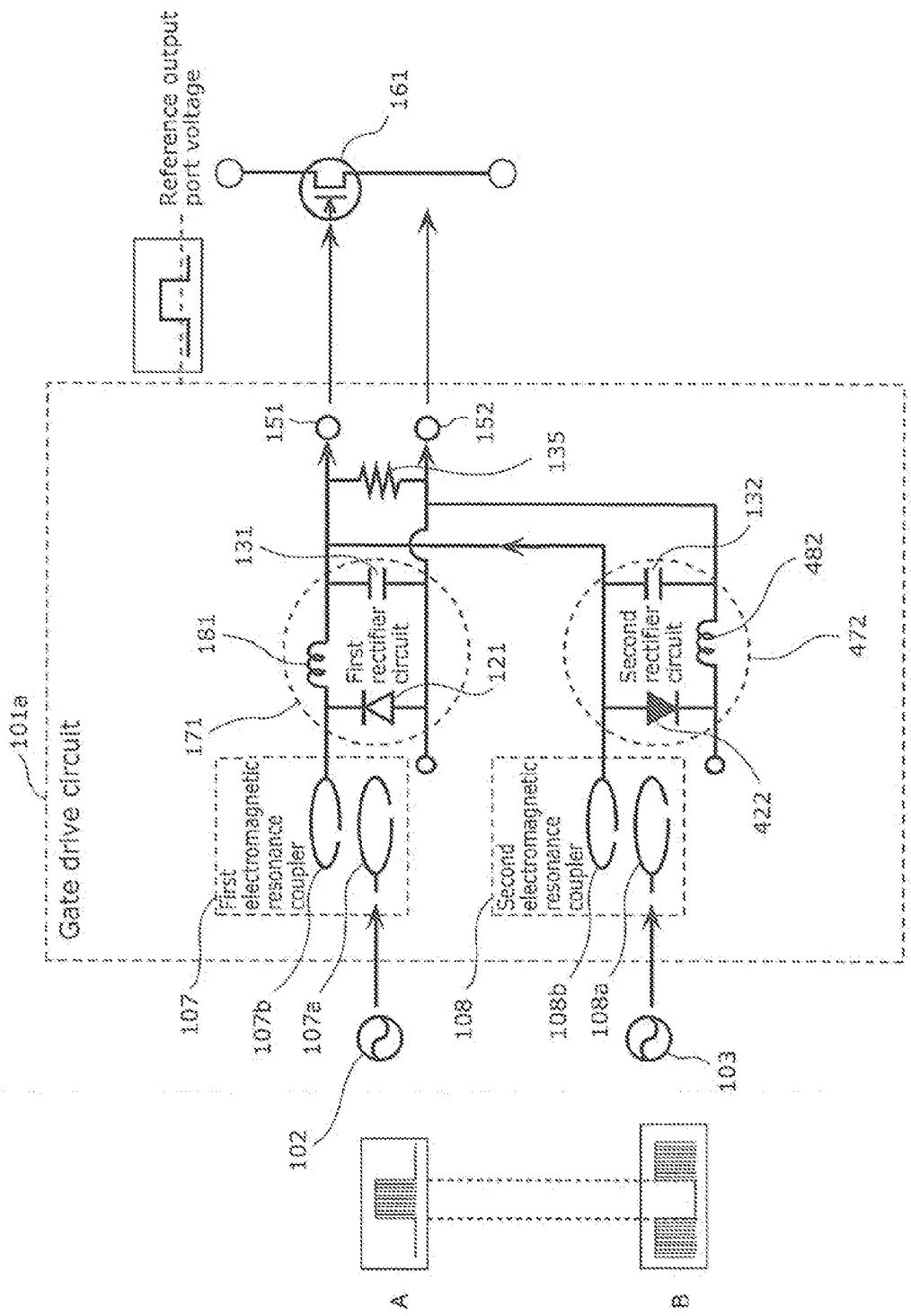
FIG. 5 is a block diagram showing a configuration of a gate drive circuit according to Modification 1 of the embodiment of the present invention.

Here, as an example, the second rectifier circuit 472 may include a single diode as shown in FIG. 5 that is the block diagram showing the configuration of the gate drive circuit 101a according to Modification 1. Even with such a gate drive circuit 101a, when the threshold voltage of the second diode 422 is larger than the threshold voltage of the first diode 121, a higher output voltage can be supplied than when the diodes have the same threshold voltage.

In order to make the threshold voltage of the second diode 422 larger than the threshold voltage of the first diode 121, a different material may be used for the anode of each of the first diode 121 and the second diode 422 (or, when the diodes are schottky diodes comprising a semiconductor and a metal, a different material may be used for the semiconductor and/or the metal). The gate drive circuit 101a shown in FIG. 5 includes a second inductor 482 connected between the cathode of the second diode 422 and the reference output port 152. Even with such a topology, the second rectifier circuit 472 according to the present modification operates as a rectifier circuit having the same function as the second rectifier circuit 172 according to the above embodiment.

As described above, the gate drive circuit according to the present embodiment and the modifications is capable of controlling the output voltage (the highest positive voltage and the lowest negative voltage), and is thus suitable for driving a semiconductor switching device with a low gate drive voltage, particularly a nitride power semiconductor switching device comprising GaN for example.

Furthermore, the gate drive circuit according to the present embodiment and the modifications can restrict the lowest negative voltage for the output voltage, and is thus suitable for driving the semiconductor switching device which tends to be broken when a high negative voltage is applied as the gate drive voltage and particularly for driving a nitride power semiconductor switching device such as GaN.

Figure 6:
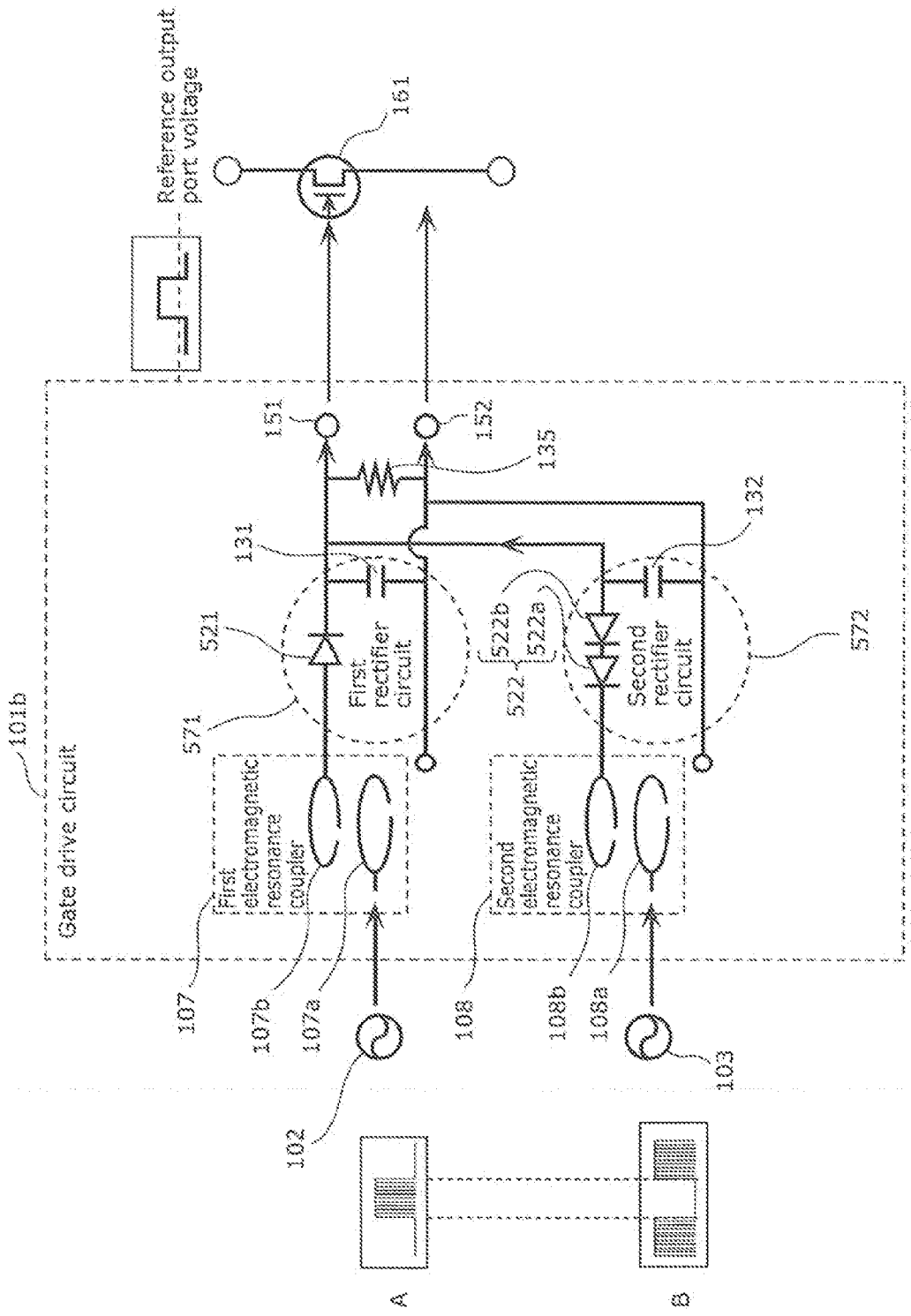
FIG. 6 is a block diagram showing a configuration of a gate drive circuit according to Modification 2 of the embodiment of the present invention.
Figure 7:
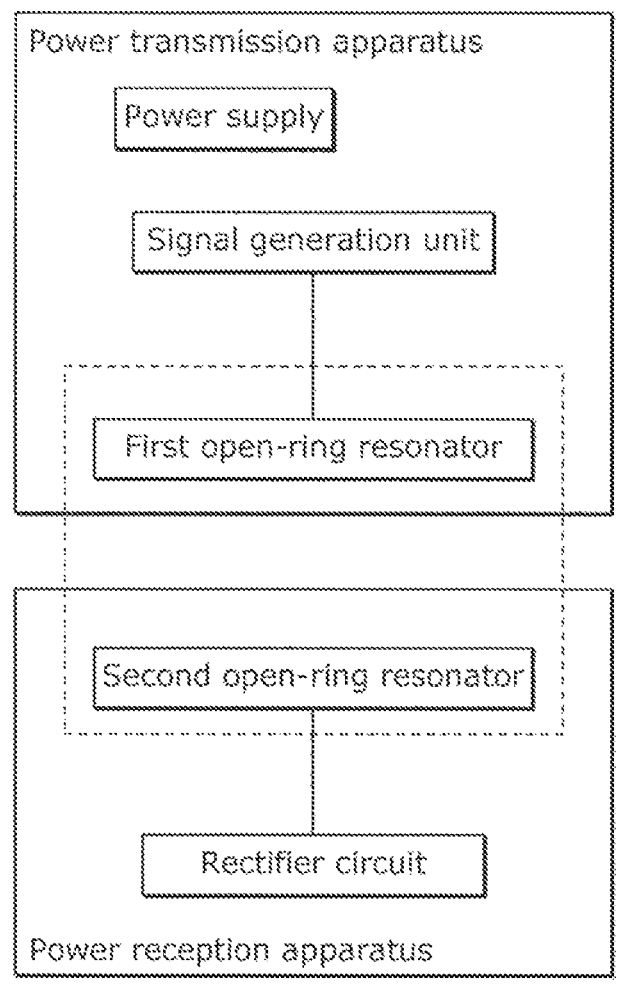
FIG. 7 is a block diagram showing a configuration of a conventional signal transmission circuit.

Moreover, the gate drive circuit 101 according to the present embodiment may include the first rectifier circuit 571 as the first rectifier circuit and the second rectifier circuit 572 as the second rectifier circuit, as shown in FIG. 6 that is the block diagram showing the configuration of the gate drive circuit 101b according to Modification 2. The gate drive circuit 101b according to this modification is different from the gate drive circuit 101 according to the above embodiment in the following points.

The first rectifier circuit 571 of the gate drive circuit 101b according to this modification includes the first diode 521 and the first capacitor 131. The anode of the first diode 521 and the first reception-side resonator 107b of the first electromagnetic resonance coupler 107 are connected, and the cathode of the first diode 521 and the signal output port 151 are connected. Furthermore, the second rectifier circuit 572 of this gate drive circuit 101b includes a second diode 522 and a second capacitor 132. The second diode 522 includes two diodes which are a diode 522a and a diode 522b connected in series. Specifically, the anode of the diode 522a and the cathode of the diode 522b are connected. The cathode of the second diode 522 (that is, the cathode of the diode 522a) and the second reception-side resonator 108b of the second electromagnetic resonance coupler 108 are connected, and the anode of the second diode 522 (that is, the anode of the diode 522b) and the signal output port 151 are connected.

Here, the second diode 522 has a threshold voltage larger than the threshold voltage of the first diode 521, in the same manner as in the above embodiment. This is realized by using the three diodes (first diode 521, diode 522a, and diode 522b) having the same characteristics (threshold voltage) for example.

Other constituent elements of the gate drive circuit 101b according to the present modification are the same as those of the gate drive circuit 101 configured as shown in FIG. 1. Even with such a configuration, the gate drive circuit 101b according to the present modification has the same rectification function as the gate drive circuit 101 according to the above embodiment does.

The foregoing has described the gate drive circuit according to the present invention based on the embodiment and the modifications. However, the present invention is not limited to the embodiment and the modifications. Embodiments obtained by applying various modifications conceived by those skilled in the art to the above embodiment and the modifications, or embodiments structured by arbitrarily combining constituents of the embodiment and the modifications, within a scope that does not deviate from the spirit of the present invention, are also included within the scope of the present invention.

For example, the gate drive circuit may be the one which includes a combination of the rectifier circuits shown in FIG. 1, FIG. 5, and FIG. 6. Specifically, the gate drive circuit according to the present invention may be implemented as a gate drive circuit including: the first rectifier circuit 171 shown in FIG. 1 and the second rectifier circuit 572 shown in FIG. 6; the first rectifier circuit 571 shown in FIG. 6 and the second rectifier circuit 172 shown in FIG. 1; and the first rectifier circuit 571 shown in FIG. 6 and the second rectifier circuit 472 shown in FIG. 5.

Furthermore, the second diode 122 of the second rectifier circuit 172 and the second diode 522 of the second rectifier circuit 572 may include: a single diode having a threshold voltage larger than that of the first diode 121 and the first diode 521, respectively; or two or more diodes having the same characteristics as or different characteristics from those of the first diode 121 and the first diode 521 connected in series, respectively.

Moreover, although the first rectifier circuit is provided with a single diode in the above embodiment and the modifications, a plurality of diodes connected in series or in parallel may be provided. Simply put, in the present invention, it is sufficient when the threshold voltage of the second diode of the second rectifier circuit which outputs the OFF state of the input signal (when a plurality of diodes are included, the threshold voltage of the diodes after combining) is set to be larger than the threshold voltage of the first diode of the first rectifier circuit which outputs the ON state of the input signal (when a plurality of diodes are included, the threshold voltage of the diodes after combining). Thus, an output signal with an ON voltage having a swing greater than a swing of the OFF voltage is output.

Furthermore, in the gate drive circuit according to the embodiment and the modifications, it is sufficient that the pull-down resistor 135 is provided only when it is needed in a relationship with the element to be driven (that is, not necessary).

Furthermore, in the gate drive circuit according to the embodiment and the modifications, the first electromagnetic resonance coupler 107 and the second electromagnetic resonance coupler 108 may be a wireless signal transmitter of another type such as a pulse transformer, a spiral inductor coupler, and so on.

Furthermore, in the gate drive circuit according to the embodiment and the modifications, the first electromagnetic resonance coupler 107 and the second electromagnetic resonance coupler 108 may be integrated as a single entity. For example, a single electromagnetic resonance coupler having two input terminals and two output terminals may be used.

The first AC signal 102 and the second AC signal 103 are exclusive signals in which the modulator zones do not overlap each other in the above embodiment and the modifications, while the input signal in the present invention is not limited to such a signal. Two modulated signals whose part of modulator zones overlap each other may be input, and two modulated signals having a time relationship including time in which no modulator zone is present may be input. Simply put, the first AC signal 102 indicating a period during which the semiconductor switching device is ON and the second AC signal 103 indicating a period during which the semiconductor switching device is OFF may be signals independent from each other and do not depend on each other. In any of the above cases, the combination of the following is output from the output terminal: the output signal from the first rectifier circuit that is output corresponding to the first AC signal 102; and the output signal from the second rectifier circuit that is output corresponding to the second AC signal 103,

INDUSTRIAL APPLICABILITY

The gate drive circuit according to the present invention is useful as a gate drive circuit which drives a semiconductor switching device, and especially as a gate drive circuit for a contactless power transmission apparatus, an electric DC isolation device, and a signal-isolation gate drive element for driving a power semiconductor switching device at high speed.

REFERENCE SIGNS LIST 10, 20 Ground pattern
11, 21 Strait portion
12, 22 Circular portion
101, 101a, 101b Gate drive circuit
102 First AC signal
103 Second AC signal
107 First electromagnetic resonance coupler
107a First transmission-side resonator
107b First reception-side resonator
108 Second electromagnetic resonance couples
108a Second transmission-side resonator
108b Second reception-side resonator
121, 521 First diode
122, 222, 422, 522 Second diode
122a, 122b, 522a, 522b Diodes included in second diode
131 First capacitor
132 Second capacitor
135 Pull-down resistor
151 Signal output port
152 Reference output port
161 Semiconductor switching device 171, 571 First rectifier circuit
172, 272, 472, 572 Second rectifier circuit
181 First inductor
182, 482 Second inductor

The invention claimed is:

1. A gate drive circuit which drives a gate terminal of a semiconductor switching device, the gate drive circuit comprising:
a signal output port and a reference output port which constitute a terminal pair for outputting a signal for driving the gate terminal;
a first wireless signal transmitter which receives a first high-frequency signal as an input, transmits the input first high-frequency signal wirelessly, and outputs the signal, the first high-frequency signal having been modulated and indicating a period during which the semiconductor switching device is ON;
a second wireless signal transmitter which receives a second high-frequency signal as an input, transmits the input second high-frequency signal wirelessly, and outputs the signal, the second high-frequency signal having been modulated and indicating a period during which the semiconductor switching device is OFF;
a first rectifier circuit which includes at least a first diode that rectifies the first high-frequency signal output from the first wireless signal transmitter to output to the signal output port a signal which has a voltage of a first polarity with respect to the reference output port; and
a second rectifier circuit which includes at least a second diode that rectifies the second high-frequency signal output from the second wireless signal transmitter to output to the signal output port a signal which has a voltage of a second polarity with respect to the reference output port, the second polarity being opposite to the first polarity,
wherein a threshold voltage of the second diode is larger than a threshold voltage of the first diode.

2. The drive circuit according to claim 1,
wherein the first rectifier circuit further includes a first inductor,
the second rectifier circuit further includes a second inductor, and
the gate drive circuit further includes a capacitor connected between the signal output port and the reference output port.

3. The drive circuit according to claim 2,
wherein the first inductor is connected between the first wireless signal transmitter and the signal output port, and
the second inductor is connected between the second wireless signal transmitter and the signal output port.

4. The drive circuit according to claim 1,
wherein the second diode includes a plurality of diodes connected in series and each having a same threshold voltage as the threshold voltage of the first diode.

5. The drive circuit according to claim 1,
wherein the first diode includes one or more diodes connected in series,
the second diode includes a plurality of diodes connected in series, and
the number of the diodes included in the second diode is greater than the number of the diodes included in the first diode.

6. The drive circuit according to claim 1,
wherein the first diode is composed of one diode,
the second diode is composed of one diode, and
a threshold voltage of the diode composing the second diode is larger than a threshold voltage of the diode composing the first diode.

7. The drive circuit according to claim 6,
wherein an anode of each of the first diode and the second diode comprises a different material.

8. The drive circuit according to claim 1,
wherein each of the first wireless signal transmitter and the second wireless signal transmitter is an electromagnetic resonance coupler including a transmission-side resonator and a reception-side resonator coupled by electromagnetic field resonance.

9. The drive circuit according to claim 1,
wherein the gate drive circuit further comprises the semiconductor switching device, and is a nitride semiconductor integrated circuit.

10. The drive circuit according to claim 1,
wherein an anode of the first diode is connected to the reference output port,
a cathode of the first diode is connected to an output terminal of the first wireless signal transmitter,
an anode of the second diode is connected to an output terminal of the second wireless signal transmitter, and
a cathode of the second diode is connected to the reference output port.

11. The drive circuit according to claim 1,
wherein an anode of the first diode is connected to an output terminal of the first wireless signal transmitter,
a cathode of the first diode is connected to the signal output port,
an anode of the second diode is connected to the signal output port, and
a cathode of the second diode is connected to an output terminal of the second wireless signal transmitter.

* * * * *